(12) United States Patent
Usami et al.

(10) Patent No.: US 7,047,172 B1
(45) Date of Patent: May 16, 2006

(54) ELECTRIC NETWORK SIMULATING METHOD, SIMULATING APPARATUS, AND MEDIUM FOR STORING SIMULATION PROGRAM

(75) Inventors: Yutaka Usami, Shizuoka-ken (JP); Takashi Kobayashi, Fuji (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/490,631

(22) Filed: Jan. 24, 2000

(30) Foreign Application Priority Data

Jan. 26, 1999  (JP)  ............................... 11-016823

(51) Int. Cl.
*G06F 17/50* (2006.01)

(52) U.S. Cl. ..................... 703/14; 703/3; 703/4; 703/9; 703/13

(58) Field of Classification Search .................. 703/14, 703/3, 4, 9, 13
See application file for complete search history.

(56) References Cited

U.S. PATENT DOCUMENTS

| | | | | |
|---|---|---|---|---|
| 5,313,398 A | * | 5/1994 | Rohrer et al. .................. | 703/14 |
| 6,141,634 A | * | 10/2000 | Flint et al. ...................... | 703/18 |
| 6,154,716 A | * | 11/2000 | Lee ................................. | 703/2 |
| 6,271,579 B1 | * | 8/2001 | Going et al. .................. | 257/664 |

OTHER PUBLICATIONS

Opal, A, "Sampled data simulation of linear and nonlinear circuits," IEEE Transactions on Computer-Aided Design of Integrated Circuits and Systems, vol.: 15 Issue: 3, Mar. 1996 pp.: 295-307.*

Chang et al. "Transient analysis of VLSI interconnects with arbitrary initial distributions and nonlinear terminations," IEEE International Conference on Computer Design: VLSI in Computers and Processors, ICCD '94. Proceedings Oct. 10-12, 1994, pp 563-566.*
Schutt-Aine, J.E., "Latency insertion method (LIM) for the fast transient simulation of large networks," IEEE Transactions on Circuits and Systems I: Fundamental Theory and Applications, vol.: 48 Issue: 1, Jan. 2001, p.(s): 81-89.*
Alvarado et al., "General Purpose Symbolic Simulation Tools for Electic Networks" IEEE Power Industry Computer Application Conference, May 1987.*
Article entitled "Computer Circuit Simulation", by Blume Wolfram, p. 165-166, p. 168-170, BYTE, vol. 11, No. 7, Jul. 1986.

* cited by examiner

*Primary Examiner*—Thai Phan
*Assistant Examiner*—Herng-der Day
(74) *Attorney, Agent, or Firm*—Frishauf, Holtz, Goodman & Chick, P.C.

(57) ABSTRACT

According to an electric network simulating method, element cells representing electric functions of a plurality of circuit elements and connection pipes representing wiring lines for connecting the circuit elements are defined. A current is defined as the number of particles moving through the connection pipe per unit time, and a voltage is defined as the number of particles present in the connection pipe. A rule for expressing the electric function of each circuit element in accordance the state of the connection pipe is set beforehand in units of element cells. The particles are transferred between the element cell and the connection pipe in accordance with the rule. The state of the electric network is simulated in accordance with the number of particles passing through the connection pipe per unit time and the number of particles present in the connection pipe.

3 Claims, 8 Drawing Sheets

```
Panod = 0.000019
Ct   = 3.8E-08
C2   = 0.000046
C3   = 6.8E-09
C4   = 0.000001
C5   = 4.3E-09
L1   = 0.0012
L2   = 0.0028
R1   = 600
R2   = 20
katu = 0.65
M    = 1.19147E-0.3
VI   = 200
L1   = 0.0012
L2   = 0.0028
M    = 1.19147E-0.3
katu = 0.65
----- OUTPUT SECTION -----
V(11)_max = 683.3895
V(11)_min = -1.087639
V(30)_max = 278.2092
V(30)_min = -388.625
I(R1)_max = 0.4600302
I(R1)_min = -0.6466231
I(R2)_max = 0.5038309
I(R2)_min = -0.563192
I(L1)_max = 1.837644
I(L1)_min = -1.170115
I(L2)_max = 0.6056873
I(L2)_min = -0.9513868
```

| CELL LIST ||||
|---|---|---|---|
| CELL NUMBER | CONNECTION NODE NUMBER || UNIQUE INFORMATION |
| NME\$(1)="V1": | NP(1)=1: | NM(1)=0: | DTA(1)=V1 |
| NME\$(2)="D1": | NP(2)=1: | NM(2)=2: | |
| NME\$(3)="X1": | NP(3)=2: | NM(3)=3: | N3(3)=4: N4(3)=5 |
| NME\$(4)="X2": | NP(4)=9: | NM(4)=10: | N3(4)=11: N4(4)=12 |
| NME\$(5)="Y1": | NP(5)=0: | NM(5)=7: | N3(5)=14: |
| NME\$(6)="R$_{C2}$": | NP(6)=3: | NM(6)=6: | DTA(6)=dt/C2 |
| NME\$(7)="V$_{C2}$": | NP(7)=6: | NM(7)=7: | DTA(7)=0 |
| NME\$(8)="X1": | NP(8)=2: | NM(8)=3: | N3(8)=4: N4(8)=5 |
| NME\$(9)="R$_{C3}$": | NP(9)=5: | NM(9)=8: | DTA(9)=dt/C3 |
| NME\$(10)="V$_{C3}$": | NP(10)=8 | NM(10)=9: | DTA(10)=0 |
| NME\$(11)="D2": | NP(11)=13: | NM(11)=10: | |
| NME\$(12)="S1": | NP(12)=11: | NM(12)=15: | N3(12)=39: N4(12)=15: DTA(12)=1 |
| NME\$(13)="X3": | NP(13)=13: | NM(13)=14: | N3(13)=15: N4(13)=16 |
| NME\$(14)="P1": | NP(14)=39: | NM(14)=15: | DTA(14)=50: DTA2(14)=0: DTA3(14)=223 |
| NME\$(15)="X4": | NP(15)=4: | NM(15)=17: | N3(15)=18: N4(15)=19 |
| NME\$(16)="X5": | NP(16)=12: | NM(16)=20: | N3(16)=21: N4(16)=22 |
| NME\$(17)="R$_{TP1}$": | NP(17)=18: | NM(17)=21: | DTA(17)=L1 * (1−ketu*ketu)/dt |
| NME\$(18)="R$_{TM1}$": | NP(18)=23: | NM(18)=26: | DTA(18)=(L1*L2−M*M)/(M*dt) |
| NME\$(19)="I$_{TP1}$": | NP(19)=20: | NM(19)=17: | DTA(19)=0 |
| NME\$(20)="X6": | NP(20)=23: | NM(20)=24: | N3(20)=25: N4(20)=30 |
| NME\$(21)="X7": | NP(21)=26: | NM(21)=27: | N3(21)=28: N4(21)=29 |
| NME\$(22)="R$_{TS1}$": | NP(22)=24: | NM(22)=27: | DTA(22)=L2 * (1−ketu*ketu)/dt |
| NME\$(23)="R$_{TM1}$": | NP(23)=19: | NM(23)=22: | DTA(23)=(L1*L2−M*M)/(M*dt) |
| NME\$(24)="I$_{TS1}$": | NP(24)=28: | NM(24)=25: | DTA(24)=0 |
| NME\$(25)="Y2": | NP(25)=30: | NM(25)=31: | N3(25)=32 |
| NME\$(26)="R1": | NP(26)=32: | NM(26)=36: | DTA(26)=R1 |
| NME\$(27)="R2": | NP(27)=31: | NM(27)=33: | DTA(27)=R2 |
| NME\$(28)="X8": | NP(28)=35: | NM(28)=36: | N3(28)=37: N4(28)=16 |
| NME\$(29)="R$_{C5}$": | NP(29)=33: | NM(29)=34: | DTA(29)=dt/C5 |
| NME\$(30)="V$_{C5}$": | NP(30)=34: | NM(30)=35: | DTA(30)=0 |
| NME\$(31)="R$_{C4}$": | NP(31)=29: | NM(31)=38: | DTA(31)=dt/C4 |
| NME\$(32)="V$_{C4}$": | NP(32)=38: | NM(32)=37: | DTA(32)=0 |
| new_i=32 | | | |

FIG. 17

ELECTRIC NETWORK SIMULATING METHOD, SIMULATING APPARATUS, AND MEDIUM FOR STORING SIMULATION PROGRAM

BACKGROUND OF THE INVENTION

The present invention relates to a simulating method and apparatus for grasping the operating status of an electric network in advance in designing the electric network, and a computer-readable storage medium for storing a simulation program.

Figure 15:
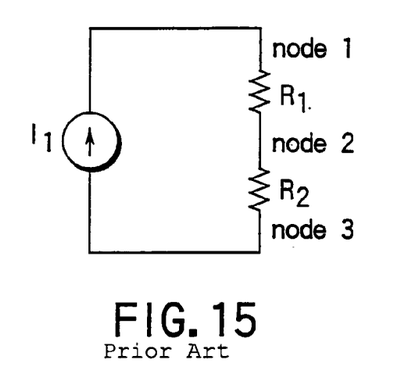
FIG. 15 is a circuit diagram for explaining a conventional method of solving an electric network.

As a conventional method of solving an electric network, for example, as shown in FIG. 15, to obtain voltages at nodes $node_1$ to $node_3$ connected to the respective elements in a circuit having resistive elements $R_1$ and $R_2$ connected in series with a current source $I_1$, the current and voltage formulas of this circuit are represented by matrix (1) as follows:

$$\begin{bmatrix} I_1 \\ 0 \\ -I_1 \end{bmatrix} = \begin{bmatrix} G_1 & -G_1 & 0 \\ -G_1 & G_1+G_2 & -G_2 \\ 0 & -G_2 & G_2 \end{bmatrix} \begin{bmatrix} V_1 \\ V_2 \\ V_3 \end{bmatrix} \quad (1)$$

where G is the conductance as the reciprocal of a resistance R.

When the above matrix is simply expressed as I=GV, it can be replaced with a mathematical problem for calculating a V matrix by giving I and G matrices. In the above matrix (1), G is LU-decomposed to rewrite matrix (1) into I=LUV. The LU matrix is comprised of lower and upper triangular matrices having elements represented by matrix (2):

$$\begin{bmatrix} G_{11} & G_{12} & G_{13} \\ G_{21} & G_{22} & G_{23} \\ G_{31} & G_{32} & G_{33} \end{bmatrix} = \begin{bmatrix} L_{11} & 0 & 0 \\ L_{21} & L_{22} & 0 \\ L_{31} & L_{32} & L_{33} \end{bmatrix} \begin{bmatrix} 1 & U_{12} & U_{13} \\ 0 & 1 & U_{23} \\ 0 & 0 & 1 \end{bmatrix} \quad (2)$$

If a Z matrix satisfying I=LZ is present, LZ=LUV holds. Z=UV is obtained by eliminating L from the right- and left-hand sides. If Z is known, V can be obtained.

The general term of the L and U matrices can be expressed by equation (3), and the Z matrix can be expressed by equation (4). The V matrix as the final solution can be expressed by equation (5). A correct solution can be obtained by sequentially solving these equations.

$$\left[ L_{im} = G_{im} - \sum_{j=1}^{m-1} L_{ij} U_{jm} \right]_{i=m,\ldots,n} \quad (3)$$

$$\left[ U_{mj} = \left( G_{mj} - \sum_{k=1}^{m-1} L_{mk} U_{kj} \right) / L_{mm} \right]_{j=m+1,m+2,\ldots,n}$$

$$\left[ Z_i = \left( I_1 - \sum_{k=1}^{i-1} L_{1k} Z_k \right) / L_{ii} \right]_{i=1,2,\ldots,n} \quad (4)$$

$$\left[ V_{n-i} = Z_{n-i} - \sum_{k=n-i+1}^{n} U_{n-i,k} V_k \right]_{i=0,1,2,\ldots,n-1} \quad (5)$$

Figure 16:
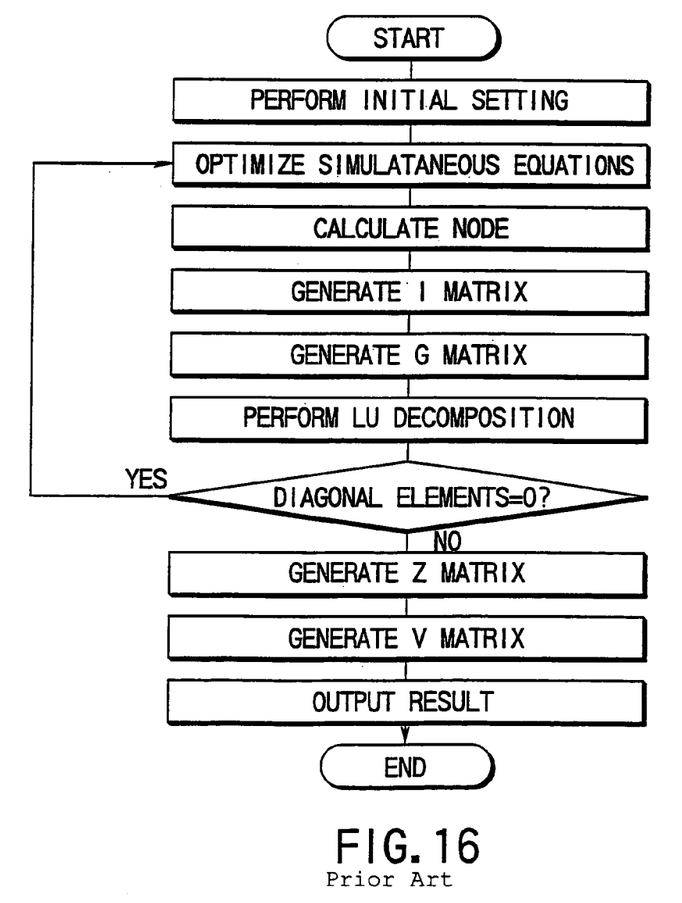
FIG. 16 is a flow chart showing the arithmetic process of the electric network.

FIG. 16 is a flow chart of the prior art. Basically, the above contents are formed into an algorithm. It should be noted that the U matrix is calculated by a division using the diagonal elements of the matrix L. The diagonal elements of the matrix L are $L_{11}$, $L_{22}$, $L_{33}$, . . . . Values (including zero) set in these diagonal elements are determined depending on the G matrix that describes the circuit.

If the circuit is comprised of only resistive elements, and the resistances do not change, the value of the G matrix is also fixed. It is, therefore, possible to make the diagonal elements of the matrix L non-zero. If the diagonal elements become zero, the condition branches to change the order of the elements of the G matrix in FIG. 16.

Assume that a resistive element has a variable R value. When the impedance value of this resistive element changes depending on the status of the circuit, that the diagonal elements of the L matrix are made non-zero is not guaranteed beforehand. In an actual algorithm, that the diagonal elements are made non-zero must always be monitored.

If a value except non-zero but infinitely close to zero is set in the diagonal element, a division error occurs in a numerical calculation expressed by a finite number of bits, and a large calculation error may occur in the subsequent calculation results. In particular, when the differential term of the terminal voltage or current of an element is given as a denominator, for example, when a calculation item in which a value obtained by subtracting a voltage at time immediately preceding given time from a voltage at the given time becomes a denominator, a voltage applied across the element is not known beforehand, but known after a simulation. The value of this denominator is unknown. When a differential coefficient is zero, i.e., when the voltage value at the time immediately preceding the given time and the voltage value at the given time are zero or almost zero, the calculation result becomes very poor due to numerical errors. The subsequent calculations are meaningless in practice. An algorithm for always monitoring the number of effective digits even for non-zero values is required.

The above problems are inevitably posed when a solution is obtained by solving a matrix. Even if the concept of the basic solution is simple, an algorithm for solving the above problems is required, resulting in redundant computation as a whole.

BRIEF SUMMARY OF THE INVENTION

It is object of the present invention to provide a simulating method and apparatus capable of reliably simulating a circuit operation with a relatively simple algorithm by regarding the circuit operation as movement of particles in a pipe, and a computer-readable storage medium which stores a simulation program.

The present invention is an electric network simulating method comprising the steps of: after setting element cells representing electric functions of a plurality of circuit elements, intersection cells representing functions of electric wiring intersections, and connection pipes representing connections between the element cells and the intersection cells, defining a current of an electric network as the number of particles moving in the connection pipe per unit time, and defining a voltage of the electric network as the number of particles present in the connection pipe; on the basis of the definitions in the defining step, setting beforehand, in units of element cells, a rule expressing an electric function of each of the circuit elements in accordance with a state of the connection pipe connected to the element cell, and setting beforehand, in units of intersection cells, a rule so that the numbers of particles present in the connection pipes connected to the intersection cell are equal to each other and a sum of the numbers of particles transferred at the intersection cell becomes zero; transferring particles between the element cell and the connection pipe and between the intersection cell and the connection pipe on the basis of the rules set in the setting step; and simulating the state of the electric network by updating the number of particles passing through a given connection pipe per unit time and the number of particles present in the given connection pipe and performing transfer and updating processes at least once.

As described above, according to the simulating method of the present invention, the electric network is defined as the flow of particles, unlike the conventional method of simulating an electric network by solving simultaneous equations. For this purpose, a circuit is replaced with and redefined by element cells representing the electric functions of the circuit elements, the intersection cells representing the functions of the electric wiring intersections, and the connection pipes representing the connections between the element cells and the intersection cells. The rule representing the electric function of each circuit element is set in units of element cells in accordance with the state of the connection pipe. The particles are transferred between the element cells and the connection pipes and between the intersection cells and the connection pipe in accordance with this rule. The number and moving amount of particles in each connection pipe, i.e., the voltage and current can be solely determined. In principle, as described above, all the currents and voltages are redefined as the amounts and movements of particles. In addition, active elements such as a switch and semiconductor element can be equivalently replaced with basic elements such as a resistive element, voltage source, and current source. According to this idea, the relative amount of particles and the moving amount per unit time in a connected connection pipe are simulated. A quick accurate simulation result can be obtained for a large electric network unlike the conventional simultaneous equation scheme in which errors occur in principle and a very long processing time is required.

The present invention is not limited to the above simulating method, but can extend to a simulating apparatus for practicing the simulating method, and a storage medium storing a computer program which is installed in a computer apparatus to perform an equivalent simulating method. The simulating method and apparatus and the storage medium can achieve a high processing speed and high-precision simulation result, which cannot be obtained in the conventional method of solving simultaneous equations, according to the gists described above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL
VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE
INVENTION

A preferred embodiment of the present invention will be described below with reference to the accompanying drawings.

Figure 1:
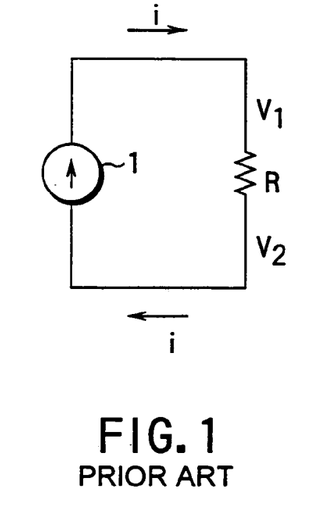
FIG. 1 is a circuit diagram showing an electric circuit example to which an embodiment of the present invention is applied.
Figure 2:
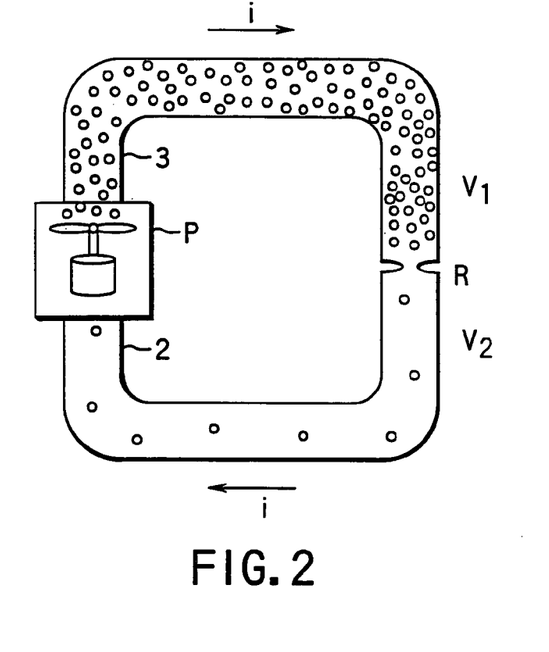
FIG. 2 is a view showing a model in which particles pass through pipes in the circuit example of FIG. 1.

FIG. 1 shows a closed loop circuit in which a resistor R is connected to a current source 1. Voltages V1 and V2 appear at two terminals of the resistor R. The current source 1 supplies a current i. A particle model equivalent to this circuit is shown in FIG. 2.

In this particle model, the current source 1 is replaced with a pump P. This pump P receives predetermined particles per unit time from a lower pipe 2 and outputs the particles to an upper pipe 3. A function corresponding to the resistor R is expressed as a restrictor for particles passing from the upper pipe 3 to the lower pipe 2. A unit volume is used for simply describing the internal volumes of the pipes 2 and 3. The number of particles in each of the pipes 2 and 3 directly represents the particle density.

When this particle density is regarded as a voltage, and the number of particles moving per unit time is regarded as a current, the restriction of the particles at the restrictor corresponding to the resistor R can be expressed as a physical amount. More specifically, for example, when the current source 1 has 1 A, and the resistor R has 100 Ω, a potential difference across the resistor R is 100V. In this case, 1 A is expressed by 1,000 particles, and the degree of restriction of the resistor R is directly expressed as 100.

In a balanced state, the difference corresponding to 100,000 (=1,000×100) particles is produced across the resistor R. The number of particles is not necessarily positive, but may be zero or negative. The final necessary result is the difference in the number of particles across the resistor R.

Figure 3A:
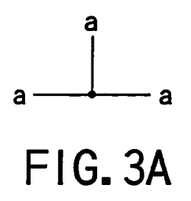
FIGS. 3A, 3B, and 3C are views showing an intersection of an electric circuit, and a model for referring to a connection pipe and a model for an intersection cell according to this embodiment.

FIG. 3A shows wiring connections in an electric circuit. An intersection in a general electric circuit is a simple connection and is not defined as an element. All nodes at the intersections are defined as a and are not discriminated from each other in the circuit.

Figure 3B:
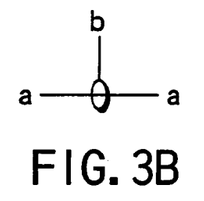
Figure 3C:
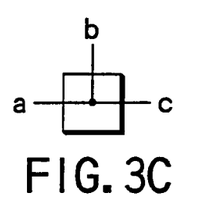

To the contrary, as shown in FIG. 3C, an intersection in a particle model is regarded to have the same function as that of an element, and all nodes connected to an intersection cell are different from each other. That is, three nodes a, b, and c are present. The number of particles present in three pipes connected to this intersection cell are averaged, and the sum of the numbers of particles moving through the pipes at the time of averaging is set to zero.

If only a voltage and current are referred to at an intersection, the voltage and current can be expressed as a combination of a given pipe through which particles are moving and a pipe for referring to the given pipe.

Figure 4A:
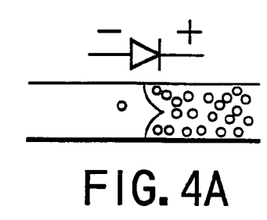
FIGS. 4A and 4B are views showing a model for a diode according to this embodiment.
Figure 4B:
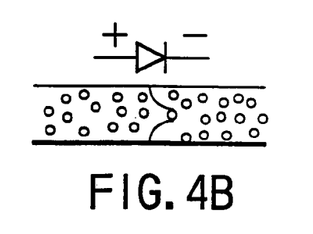

FIGS. 4A and 4B show an element cell imitating a diode function. This element cell has two terminals having polarities. For example, as shown in FIG. 4A, assume that the cathode and anode are defined to have positive and negative polarities, respectively. If the number of particles in the cathode-side pipe is larger than that in the anode-side pipe, no particle movement occurs. However, as shown in FIG. 4B, when the cathode and anode are negative and positive, respectively, the particles smoothly move from the anode to the cathode with an increase in the number of particles.

A description of an element cell having this function allows obtaining diode characteristics as the rectification function. If more strict diode characteristics are required, i.e., if a junction capacitance, junction potential, temperature coefficient, and breakdown voltage are also included, a cell may be defined as an arbitrary function including these factors. If it is redundant to describe the diode as one element cell, a diode may be described in detail as a combination of basic linear elements.

Figure 5A:
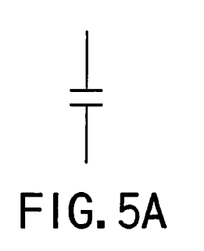
FIGS. 5A and 5B are circuit diagrams showing a capacitor and an equivalent model for the capacitor according to this embodiment.
Figure 5B:
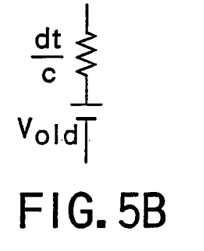

A capacitor element will be modeled. A capacitor can be expressed as a current integration formula of a terminal voltage V, as indicated by equation (6) below. If this is regarded as the sum of regions segmented with finite shortest time intervals, the integration symbol can be expressed as a Σ function. This can be expressed as the primary term between the current and a terminal voltage $V_{old}$ of the immediately preceding time.

$$V = \frac{1}{C}\int idt = \frac{dt}{C}\sum i = V_{old} + \frac{dt}{C}i \quad (6)$$

The above equation as a linear equation between the current and voltage has a voltage source as $V_{old}$ and a resistive component as dt/C. When this arrangement is decomposed into basic linear elements and equivalently expressed, the capacitor C shown in FIG. 5A can be expressed as a series connection of a resistive element dt/C and a voltage source $V_{old}$, as shown in FIG. 5B.

A calculation for an arrangement including this capacitor is performed at given time t, and its operating state at time immediately preceding the given time is already confirmed. In the calculation at given time t, $V_{old}$ can be regarded as a voltage source having a fixed value. The shortest time section dt of the resistive element is known, and the capacitance of the capacitor C is also known. These values are also fixed values. Therefore, the behavior of the capacitor at time t can be expressed by these basic elements.

Figures 6A, 6B:
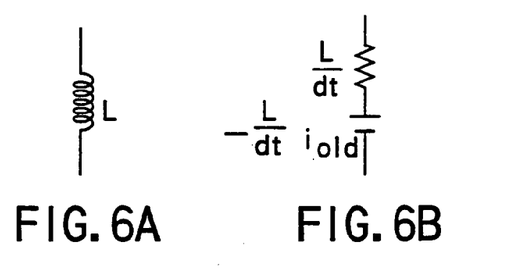
FIGS. 6A, 6B, and 6C are circuit diagrams showing an inductor, and equivalent models for the inductor according to this embodiment.
Figure 6C:
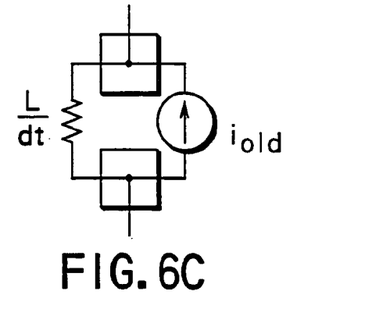

An inductor element will be modeled below. As represented by equation (7), the left-hand side may be described with V as in the capacitor. In this case, the right-hand side becomes a current differential term. Equation (7) can be solved, but a current value in an insufficient convergent state is inaccurate. It may often be unpreferable to apply the differential to an inaccurate current.

As indicated by equation (8), the current is defined on the left-hand side, and the voltage integration value is defined on the right-hand side. The current at time t is the sum of the current value L/Dt×$i_{old}$ flowing at time immediately preceding time t and the current flowing through the resistor, as shown in FIG. 6B. If this is expressed using basic elements, the inductor L shown in FIG. 6A is expressed as a parallel connection between the resistive element L/dt and the current source $i_{old}$, as shown in FIG. 6C.

$$V = L\frac{di}{dt} = \frac{L}{dt}i - \frac{L}{dt}i_{old} \quad (7)$$

$$i = \frac{1}{L}\int Vdt = \frac{dt}{L}\sum V = i_{old} + \frac{dt}{L}V \quad (8)$$

Figure 7:
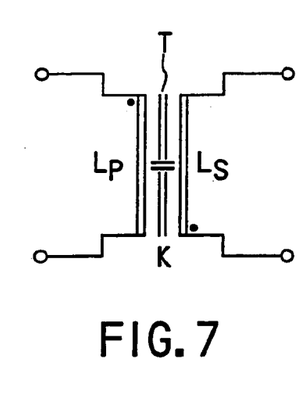
FIG. 7 is a circuit diagram of a leakage transformer.

FIG. 7 shows the general notation of a leakage transformer T. In this transformer T, two inductors, i.e., Lp and Ls are magnetically coupled. The degree of coupling is expressed by a coupling coefficient k. The equations holding on the primary and secondary sides of this transformer T are given by equations (9), (10), and (11)

$$V_p = L_p\frac{di_p}{dt} + M_{ps}\frac{di_s}{dt} \quad (9)$$

$$V_s = L_s\frac{di_s}{dt} + M_{ps}\frac{di_p}{dt} \quad (10)$$

$$M_{ps} = k\sqrt{L_pL_s} \quad (11)$$

where $M_{ps}$ is the transinductance.

The modification of equations (9), (10), and (11) in accordance with the same idea as in the inductor yields equations (12) and (13):

$$i_p = i_{ppast} + \frac{dt}{L_p(1-k^2)}V_p - \frac{Mdt}{L_pL_s - M_{ps}^2}V_s \quad (12)$$

$$i_s = i_{spast} + \frac{dt}{L_s(1-k^2)}V_s - \frac{Mdt}{L_pL_s - M_{ps}^2}V_p \quad (13)$$

where $i_{ppast}$ and $i_{spast}$ are currents flowing through the primary and secondary sides at time immediately preceding time t, and $V_p$ and $V_s$ are terminal potential differences on the primary and secondary sides at time t.

Figure 8:
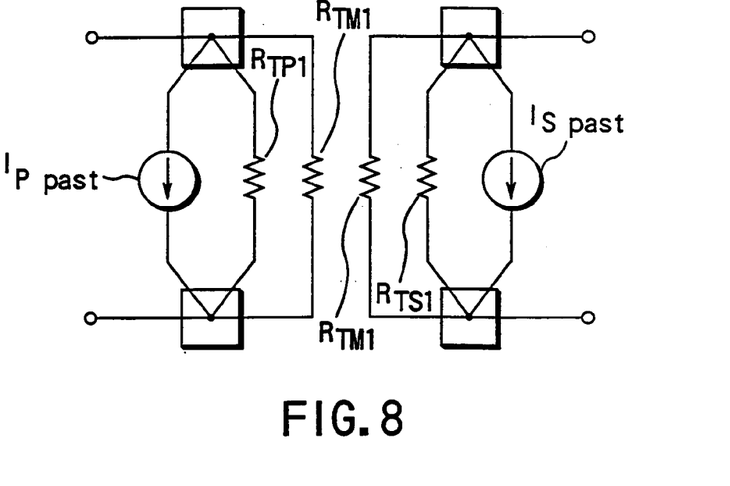
FIG. 8 is a circuit diagram showing the equivalent model for the leakage transformer according to this embodiment.

These equations are implemented with element cells as a model shown in FIG. 8. That is, this model can be expressed as current source cells $I_{Ppast}$ and $I_{Spast}$, resistor cells $R_{TP1}$ and $R_{TS1}$, $R_{TM1}$, and $R_{TM1}$, and intersection cells.

How to recognize this circuit diagram will be described below.

Figure 9:
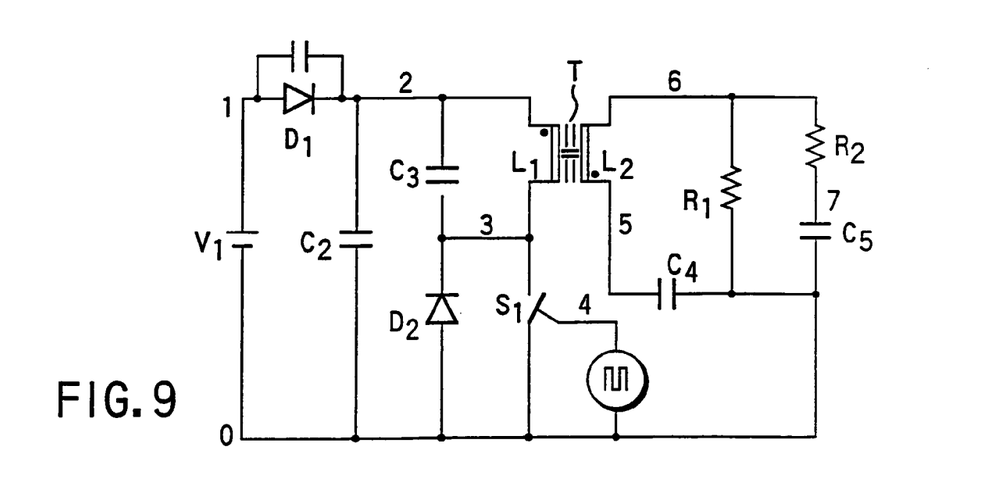
FIG. 9 is a circuit diagram showing a half-wave voltage resonance inverter.

FIG. 9 shows a one-resonator type half-wave voltage resonance inverter. In this inverter, a capacitor C2 is connected to a DC power supply V1 via a diode D1. A series circuit of a switch S1 and a parallel circuit of a capacitor C3 and a primary side L1 of the leakage transformer T is connected to the capacitor C3. A diode D2 is connected in parallel to the switch S1 in an opposite polarity, thereby forming a half-wave switch circuit.

A load circuit R1 is connected to a secondary side L2 of the transformer T via a capacitor C4. A series circuit of a resistor R2 and capacitor C5 is connected in parallel to the load circuit R1.

This inverter is powered by the DC power supply V1. The half-wave switch circuit made up of the switch S1 and diode D2 turns on/off a parallel resonator made up of the capacitor C3 and the primary side L1 to continue parallel resonance. Part of the resonance energy is transmitted to the secondary side using the leakage component of the transformer T to drive the load circuit R1.

Figure 10:
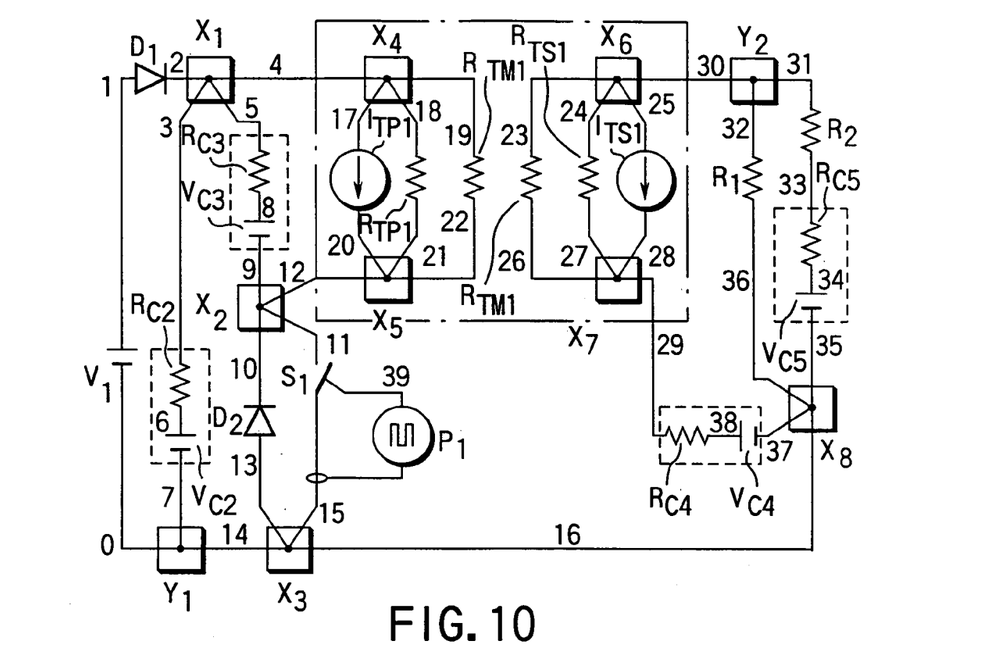
FIG. 10 is a circuit diagram showing the equivalent model for the half-wave voltage resonance inverter according to this embodiment.

This inverter can be replaced with the element cells described above as an equivalent cell circuit diagram shown in FIG. 10. More specifically, the capacitor C2 is connected in series with a resistive element $R_{C2}$ and voltage source $V_{C2}$. The capacitor C3 is connected in series with a resistive element $R_{C3}$ and voltage source $V_{C3}$. The capacitor C4 is connected in series with a resistive element $R_{C4}$ and voltage source $V_{C4}$. The capacitor C5 is connected in series with a resistive element $R_{C5}$ and voltage source $V_{C5}$. The leakage transformer T is expressed as a combination of current source cells $I_{TP1}$, and $I_{TS1}$, resistor cells $R_{TP1}$, $R_{TS1}$, $R_{TM1}$, and $R_{TM1}$, and intersection cells X4, X5, X6, and X7.

Reference symbols Y1 and Y2 in FIG. 10 denote intersection cells each at which three pipes intersect. Reference symbols X1, X2, ..., X8 denote intersection cells each at which four pipes intersect. The internal processes of these pipes are the same although the numbers of intersecting pipes are different. The switch S1 is expressed as a turn-on/off function as in the diode. The ON/OFF state of the switch S1 is determined by a voltage (number of particles) applied to the control terminal. A pulse source P1 is connected to the control terminal, and its reference potential is given as a switch control voltage obtained by making a reference cell (i.e., a cell for referring to the number of particles in a pipe to be referred to) refer to the number of particles at a node 15 and adding the number of particles corresponding to a predetermined pulse voltage to the number of particles referred to by the reference cell. The node names are identical at the intersections in FIG. 9. However, since nodes are newly assigned in FIG. 10, nodes 0 to 39 are set in FIG. 10, while nodes 0 to 7 are set in FIG. 9.

Figure 17:
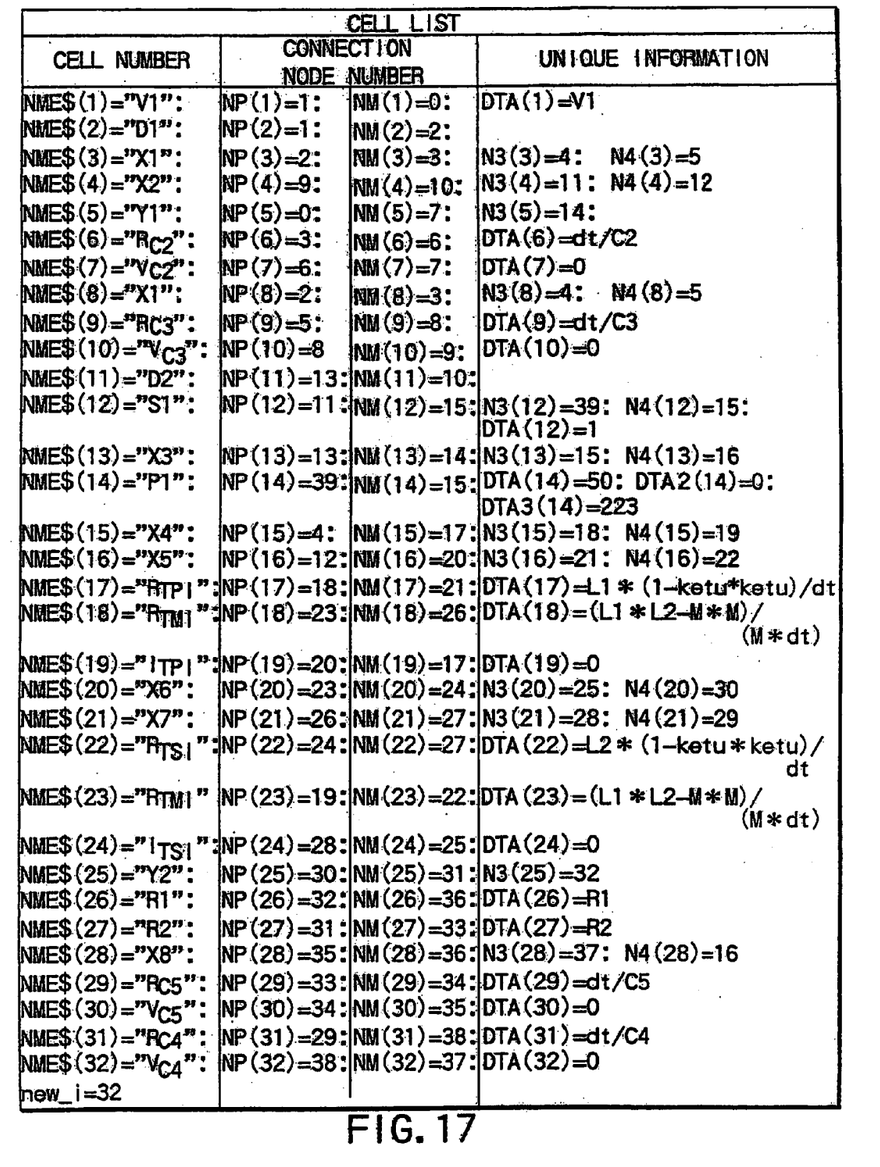
FIG. 17 is a table showing a cell list according to this embodiment.

An array shown in FIG. 17 is defined as information for inputting such an equivalent cell arrangement. NME$ in FIG. 17 is an array for storing the name of an element cell or intersection cell. The first character of the name represents the attribute of the cell. The index of the array starts from "1", and the number of indices is the number of cells. Since the total number of cells is 32, indices are "1" to "32".

Cells (element cells and intersection cells) required in the present invention are listed in FIG. 17.

According to the cell list in FIG. 17, NP and NM represent arrays for storing node numbers of nodes to which a cell is connected. When the number of terminals of an element is three or more, arrays N3, N4, ..., Nn are used following the arrays NP and NM. When an element has polarities, a polarity description becomes important. The polarity has particularly no meaning for an element having no polarity, such as a resistor. However, for convenience, the same notation is employed. DTA represents an array for storing unique information of a cell. A voltage value is set in a voltage source, a resistance value is set in a resistive element, and no value is set in a cell such as an intersection cell that does not require particular unique information. When an electric element such as a capacitor, inductor, or leakage transformer, which is expressed as a combination of more basic equivalent cells, the respective equivalent cells describe unique information of the cell. In this case, the unique information is obtained from the above-described equivalent equations.

A variable new_i described last loops the process the number of cells. The number of particles present in a pipe is stored in an array V(i), and the number of particles passing per unit time is stored in an array II(i), where i is not the cell number but the pipe node number. The number of arrays V or II is equal to the number of pipes. If an initial value is required in analysis of an arrangement including an inductor and capacitor, the values obtained in equations (6) to (8) described above are set as initial data of the arrays V and II.

A practical example of a program for transferring particles in cells will be described below. For example, a process for a resistor cell starting from R is described as follows.

Case "R"

$V\_temp = V(NP(i), t\_cell) - V(NM(i), t\_cell)$ $i\_temp = V\_temp / DTA(i)$ $V(NP(i), t\_cell) = V(NP(i), t\_cell) - i\_temp$ $V(NM(i), t\_cell) = V(NM(i), t\_cell) + i\_temp$ wherein V is the array for storing the number of particles. If an array is defined as V(i,t) including the time dimension, i represents the node number assigned to a pipe. The number i is not a number corresponding to the loop order of the variable new_i defined by the array NM$(i), and t represents the number of steps corresponding to calculation time. To obtain a steady solution, the t term is unnecessary. When transient operation analysis is required, t is updated shortest time interval.

V(NP(i),t_cell) represents the number of particles for the number of steps t_cell in a pipe represented by a positive node array NP(i). Similarly, V(NM(i),t_cell) is the number of particles in a pipe represented by a negative node array NM(i). A difference V_temp between the above numbers of particles is the difference between the numbers of particles in pipes at two terminals of the resistive cell. This difference represents the potential difference. Since the resistance value is input in the DTA array for a resistor cell, a particle flow corresponding to the current to be flowed can be expressed as i_temp=V_temp/DTA(i). In the resistor cell, particles flow from the positive terminal, and the particles equal in number to the input particles are output from the negative terminal. The number of particles corresponding to i_temp is added to or subtracted from the numbers of particles in the pipes at the two terminals of the resistor cell. The foregoing is the cell function as that of the resistor.

The diode cell is a cell having a rectification function of flowing a current in the forward direction but flowing no current in the opposite direction. The diode cell defines a voltage corresponding to the p-n junction potential when the current flows in the forward direction.

Case "D"

$$V\_temp = V(NP(i), t\_cell) - V(NM(i), t\_cell)$$

IF V_temp>0.7 Then $$V(NP(i), t\_cell) = V(NP(i), t\_cell) - V\_temp/2$$

$$V(NM(i), t\_cell) = V(NM(i), t\_cell) + V\_temp/2$$

End If

The potential difference V_temp applied to the diode cell in the same manner as described above is calculated. When NP(i) and NM(i) are defined as the anode and cathode sides of the diode, respectively, V_temp is the potential difference when viewed from the anode side to the cathode side and corresponds to the forward voltage. Assume that the particles move when the forward voltage is 0.7V or more, and the number of moving particles is given as V_temp/2. The number of particle at one terminal of the element must be equal to that at the other terminal of the element. A description is made such that the number of particles V_temp/2 is subtracted from that on the anode side and added to that on the cathode side. When the forward voltage is 0.7V or less, the diode is cut off, and no particles move through the diode. In this case, no description need be made for particle movement.

An intersection cell having, e.g., three terminals can be described as follows. An intersection in an electric circuit must receive and output a common voltage and have the total sum of input/output currents as zero. These two conditions are necessary in solving simultaneous equations. The function to be described for the intersection cell is to satisfy the condition that the numbers of particles between the connected pipes are equal to each other. When this intersection cell functions, the total sum of input/output particle flows (numbers of particles per unit time) consequently becomes zero in the balanced state. In the particle model, obviously, the number of particles (voltage) is the basic physical amount, while the particle flow (current) is a subordinate physical amount.

Case "Y"

$$V\_temp = (V(NP(i), t\_cell) + V(NM(i), t\_cell) + V(N3(i), t\_cell))/3$$

V(NP(i),t_cell)=V_temp

V(NM(i),t_cell)=V_temp

V(N3(i),t_cell)=V_temp

A current source cell sets a status in which a constant current flows in a steady state. The number of particles per unit time is input and output to the two end pipes. Since the number of times the scan loop of the cell is performed per unit time is proportional to the current value, a value set in the DTA array is a coefficient multiple of the current value. The most understandable method is to set the current value itself in the DTA array and perform the scan loop once per unit time.

Case "I"

$$V(NP(i), t\_cell) = V(NP(i), t\_cell) + DTA(i)$$

$$V(NM(i), t\_cell) = V(NM(i), t\_cell) - DTA(i)$$

An analysis algorithm using these cells will now be described.

Figure 11:
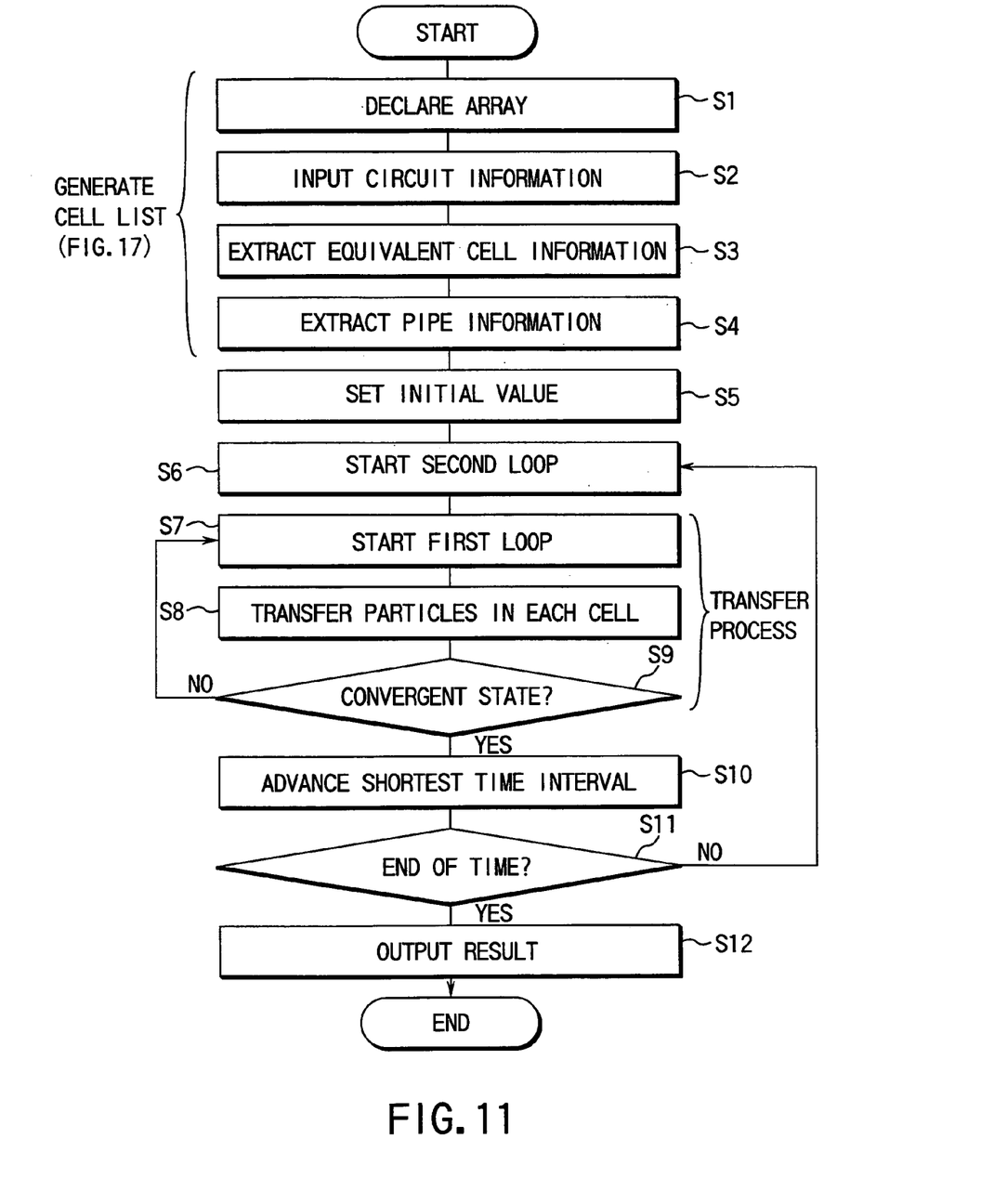
FIG. 11 is a flow chart showing a transient operation analysis process according to this embodiment.

FIG. 11 is a flow chart showing an example of transient operation analysis. When the program runs, an array declaration is performed in S1. That is, a memory area for necessary arrays and variables is assured. In S2, information for a circuit to be analyzed is input. The input circuit information is circuit data of a general electric circuit.

In S3, equivalent cell information is extracted. In S4, pipe information is extracted. More specifically, since the circuit data of the electric circuit includes data that cannot be directly expressed as element cells, the circuit data are developed as circuit information of equivalent cells. In this case, intersections are replaced with intersection cells, and node numbers shared by the intersection positions are replaced with those of the intersection cells. The node numbers are defined as entirely different node numbers. These node numbers are used to identify pipes. At this moment, a cell list in FIG. 17 is almost finished.

In S5, initial values are set. More specifically, the initial electric state for executing a simulation is set. For example, the initial value for a capacitor is an initial voltage, and the initial value for an inductor is an initial current. The initial voltage indicates that the initial number of particles present in a pipe is determined, i.e., the initial value of the V array is determined. The initial current indicates that the number of particles flows into or out from an inductor per initial unit time is determined as the II array beforehand.

A loop structure will be described. The "transfer of particles in each cell" in this loop structure indicates that particles are transferred in the cells shown in FIG. 17 in accordance with the attributes and pieces of unique information of these cells. This transfer is performed for all the cells.

The first loop (S7) is to simulate the steady state of the circuit at given time. In the first loop, the states of the particles are not balanced as a whole at the beginning. When transfer (S8) is repeated several times, the numbers of particles and particle movements in the pipes converge. When a predetermined convergence condition is satisfied, the state at the given time is regarded to be confirmed, and the first loop is ended. The convergence is determined such that in the first loop, the differences between previous and current values of all or important parts of the V and II arrays are smaller than the convergence error (S9) and are compared with predetermined convergence condition.

When the first loop is ended, the time advances a shortest time interval (S9), and the flow returns to the first loop again. This repetition is performed in the second loop (S6). This loop is repeated from time 0 to desired time (S11) and ended (S12). When the time advances the shortest time interval, the following operation is performed. For example, equivalent conversions shown in FIGS. 5A and 5B and FIGS. 6A and 6B are performed for the capacitor and inductor. For example, in the inductor equivalent model shown in FIG. 6C, a new impedance obtained upon the lapse of the shortest time interval is calculated by regarding as each II array the total sum of the numbers of particles per unit time flowing in the equivalent model at time preceding the shortest time interval. This impedance is newly set as the unique information of the current source $i_{old}$. The unique information of the voltage source of the equivalent model (FIG. 5B) for the capacitor is similarly calculated from the value of the V array at time preceding the shortest time interval.

In this transient operation analysis, convergence in the first loop is important and must be strictly determined. If this determination is less strict, the result adversely affects the subsequent operations on the time basis.

Figure 12:
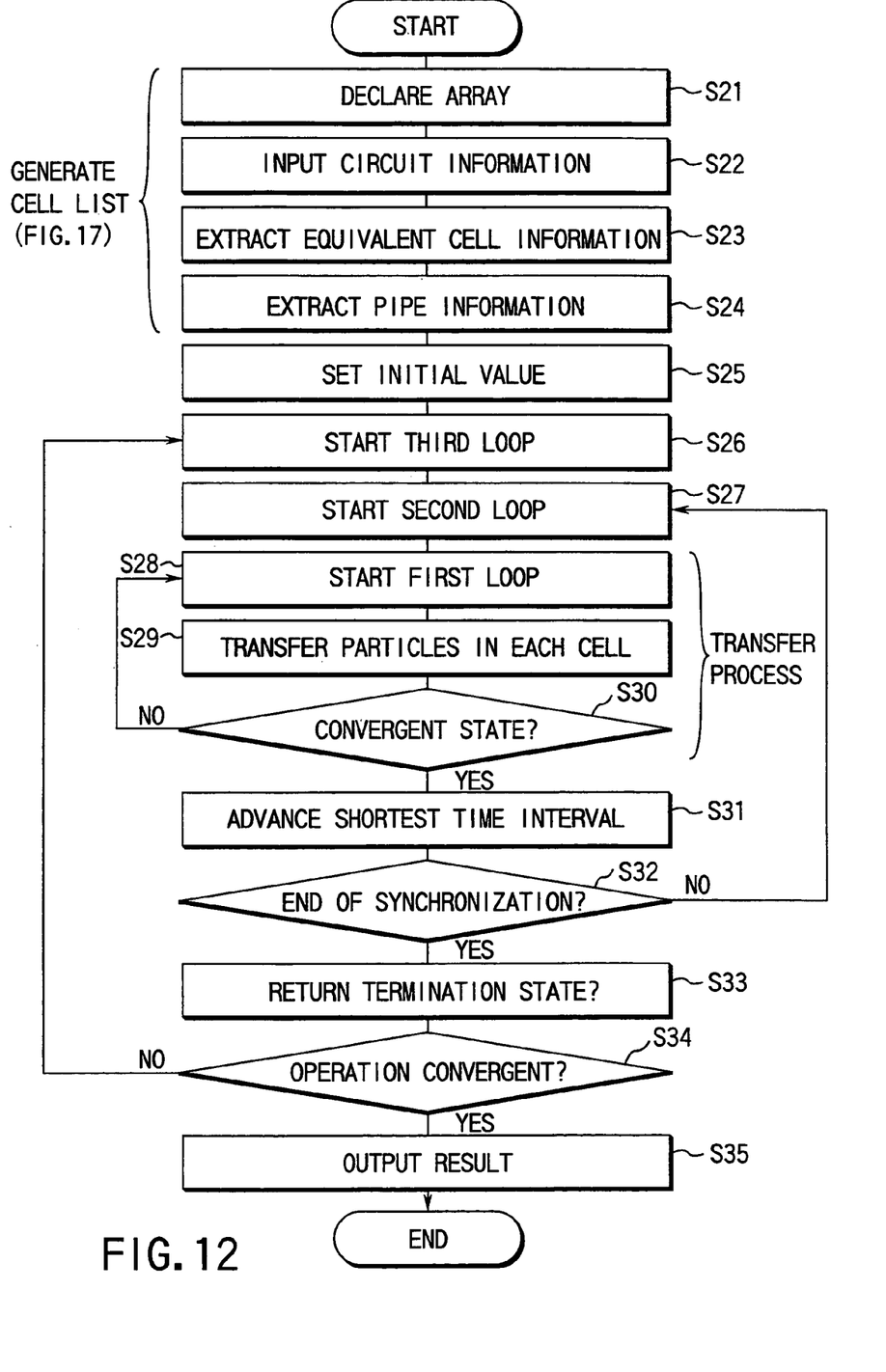
FIG. 12 is a flow chart showing a periodic operation analysis process according to this embodiment.

FIG. 12 is a flow chart showing an example of periodic operation analysis. The basic flow (S21 to S24, S27 to S32, and S35) is the same as in the transient operation analysis described above, except that the second loop in the transient operation analysis is determined on the basis of time, while the second loop is ended at the end of the period in the periodic operation analysis (S33), and the third loop is newly installed in the periodic operation analysis.

In the periodic operation analysis, a one-period simulation is complete at the end of the second loop. This indicates that one-period transient operation analysis is performed for the given initial condition. In an actual circuit as well, the periodic operation stabilizes to obtain a steady state several cycles after the start with the initial condition. This also applies to the simulation. To obtain the steady state in the periodic operation, the third loop (S34 and S26) must be repeated several times.

The above operation is equivalent to repetition of transient operation analysis, but the periodic operation analysis has an advantage in that the convergence condition in the first loop can be less strict at the beginning. More specifically, the process for obtaining the steady solution of the period need not always trace a transiently correct process. Rather, the third loop is repeated a larger number of times to make an element having a large time constant converge.

Figure 13:
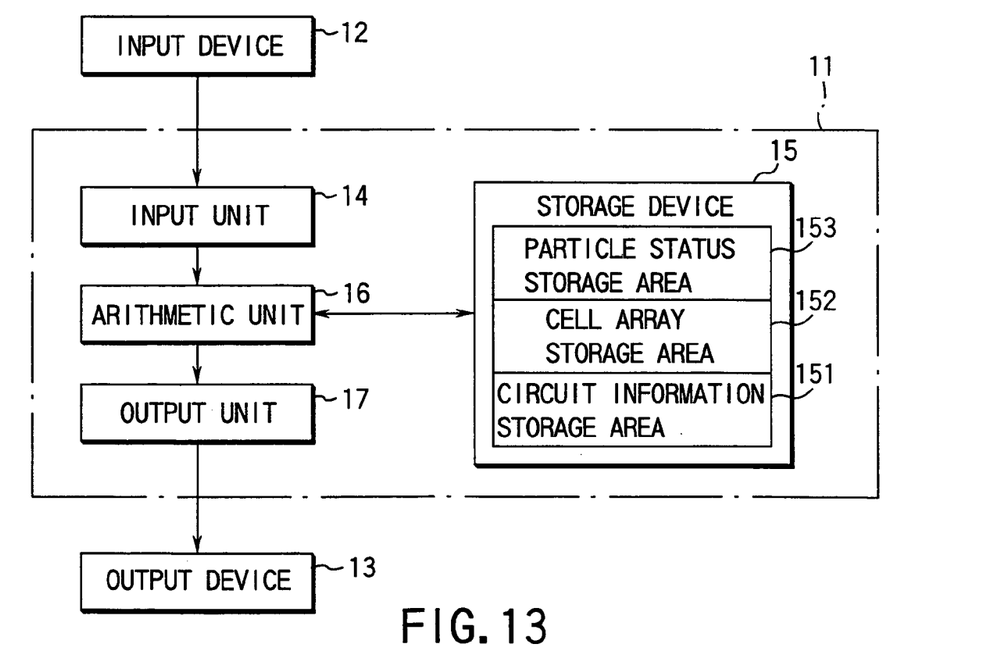
FIG. 13 is a block diagram showing the arrangement of a simulating apparatus according to this embodiment.

FIG. 13 is a block diagram showing the arrangement of a simulating apparatus for implementing the above simulation. The simulating apparatus is comprised of a simulation unit 11, input device 12, and output device 13. An example of the input device 12 is a keyboard for directly inputting circuit connection information with key operations, or a storage medium such as a floppy disk or magnetooptical disk for storing circuit connection information in the form of a file and loading the stored circuit connection information to the simulation unit 11. An example of the output device 13 is a display for displaying a simulation result on the monitor screen or a printer for printing it out.

The simulation unit 11 is comprised of an input unit 14, arithmetic unit 16, and output unit 17. The input unit 14 converts the circuit connection information from the input device 12 into information suitable for internal processing and receiving the converted information. The arithmetic unit 16 performs the following arithmetic operations. That is, the arithmetic unit 16 writes the information from the input unit 14 in a circuit information storage area 151 of a storage unit 15, creates an equivalent cell model on the basis of the written information, and stores the model information in a cell array storage area 152. The arithmetic unit 16 also sequentially stores the number of particles in a pipe connected to each cell and the number of particles moving per unit time in a particle status storage area 153 and sets an initial value in the storage area 153. The output unit 17 converts the arithmetic result of the arithmetic unit 16 into a format suitable for the output device 13.

Figure 14:
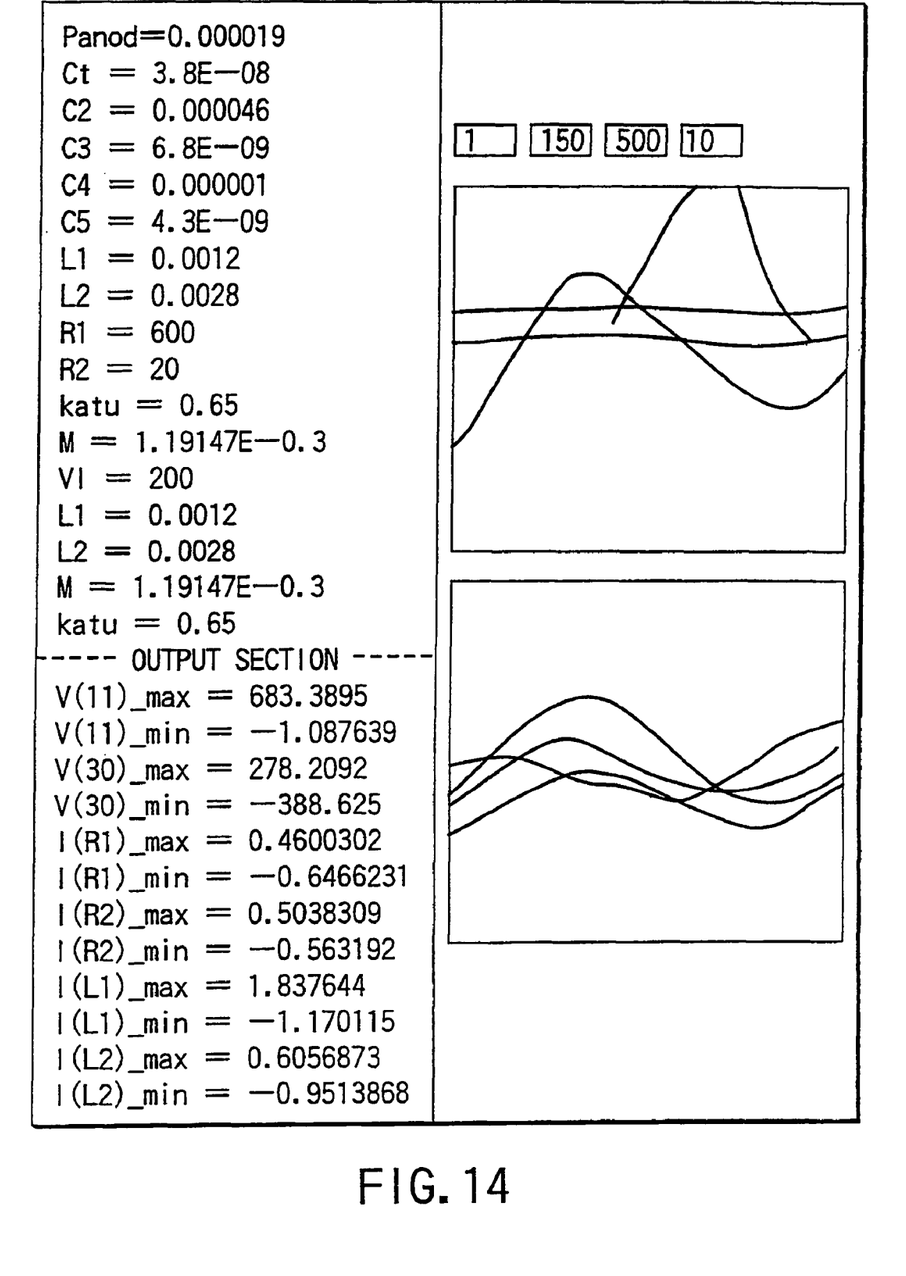
FIG. 14 is a view showing an output example in the simulating apparatus.

An output example on the monitor screen upon simulating a circuit operation using the simulating apparatus having the above arrangement is shown in FIG. 14. This output example shows the simulation result obtained using the circuit arraignments shown in FIGS. 9, 10, and 17 in accordance with the flow chart of periodic operation analysis shown in FIG. 12. The constants of the circuit elements are listed and output on the left side of the screen, while the node voltage and current waveforms that are desired at the switching period are displayed on the right side of the screen. The conditions for convergence determination are displayed in the four windows on the upper right position of the screen.

Using this simulating apparatus, the operating status of the circuit can be easily grasped, and circuits can be efficiently designed. More specifically, since circuit operation is basically defined as the movement of particles in each pipe, the arithmetic contents are additions or subtractions. Since no divisions are performed, an overflow as the essential factor of an algorithm does not occur. Calculations are not interrupted and simulations within predetermined time ranges can be performed regardless of combinations of the circuit arrangements and circuit elements.

Note that although the additions and subtractions are performed for pipes, divisions may be included depending on the element functions of element cells. For example, in a description of an element cell representing a resistive element, a moving amount of particles corresponding to a current is calculated by a division using the resistance value. If the resistance value is set to zero, an overflow occurs. However, the resistance value is known beforehand, and appropriate processing can be simply performed. That is, when element cells are properly described, the arithmetic operations can be separated from the simulating method itself.

The storage medium such as a floppy disk or magnetooptical disk can also store the simulating processing program itself executed by the simulation unit 11 in addition to the circuit connection information. The simulation unit 11 loads the simulation processing program from the storage medium and then loads the circuit connection information to perform circuit operation simulations.

As has been described above, according to the present invention, circuit operations are defined as movements of particles in pipes. There can be provided an electric network simulating method capable of reliably simulating circuit operations with a relatively simple algorithm.

In addition, according to the present invention, circuit operations are defined as movements of particles in pipes. There can be provided an electric network simulating apparatus capable of reliably simulating circuit operations with the relatively simple algorithm.

According to the present invention, there can also be provided a storage medium that stores a simulation program capable of reliably simulating circuit operations with the relatively simple algorithm.

What is claimed is:

1. A method for simulating an electric network including a plurality of circuit elements connected by a plurality of wiring lines, said method comprising:

defining electric functions of the plurality of circuit elements as a plurality of element cells;

defining intersections of the wiring lines at which at least three of the circuit elements are connected as intersection cells;

defining as a plurality of pipes, wiring lines extending between any of: (i) an element cell and another element cell, (ii) an intersection cell and another intersection cell, and (iii) an element cell and an intersection cell;

setting respective rules of transfer of particles through the element cells based on respective types of the element cells, and setting respective rules of transfer of particles through the intersection cells;

performing transfers of the particles through the element cells and the intersection cells based on the respective rules;

repeating the transfers until a predetermined convergence condition is satisfied at which a respective number of particles in each of the pipes is substantially steady and a respective number of particles moved through each of the element cells and intersection cells is substantially steady;

determining the number of particles in each of the pipes and the number of particles moved through each of the element cells and each of the intersection cells when the predetermined convergence condition is satisfied; and determining voltages in the electric network based on the determined number of particles in each of the pipes, and determining currents in the electric network based on the determined number the particles moved through each of the element cells and intersection cells, without solving simultaneous differential equations.

2. An apparatus for simulating an electric network including a plurality of circuit elements connected by a plurality of wiring lines, said apparatus comprising:

a defining unit configured to: define electric functions of the plurality of circuit elements as a plurality of element cells, define intersections of the wiring lines at which at least three of the circuit elements are connected as intersection cells, and define as a plurality of pipes, wiring lines extending between any of: (i) an element cell and another element cell, (ii) an intersection cell and another intersection cell, and (iii) an element cell and an intersection cell;

a setting unit configured to set respective rules of transfer of particles through the element cells based on respective types of the element cells, and to set respective rules of transfer of particles through the intersection cells;

a determining unit configured to: (i) perform transfers of the particles through the element cells and the intersection cells based on the respective rules, (ii) repeat the transfers until a predetermined convergence condition is satisfied at which a respective number of particles in each of the pipes is substantially steady and a respective number of particles moved through each of the element cells and intersection cells is substantially steady, and (iii) determine the number of particles in each of the pipes and the number of particles moved through each of the element cells and each of the intersection cells when the predetermined convergence condition is satisfied; and a second determining unit configured to: (i) determine voltages in the electric network based on the determined number of particles in each of the pipes, and (ii) determine currents in the electric network based on the determined number the particles moved through each of the element cells and intersection cells, without solving simultaneous differential equations.

3. A storage medium having a simulation program stored thereon for causing a computer to simulate an electric network including a plurality of circuit elements connected by a plurality of wiring lines, said simulation program causing the computer to perform the steps of:

defining electric functions of the plurality of circuit elements as a plurality of element cells;

defining intersections of the wiring lines at which at least three of the circuit elements are connected as intersection cells;

defining as a plurality of pipes, wiring lines extending between any of: (i) an element cell and another element cell, (ii) an intersection cell and another intersection cell, and (iii) an element cell and an intersection cell;

setting respective rules of transfer of particles through the element cells based on respective types of the element cells, and setting respective rules of transfer of particles through the intersection cells;

performing transfers of the particles through the element cells and the intersection cells based on the respective rules;

repeating the transfers until a predetermined convergence condition is satisfied at which a respective number of particles in each of the pipes is substantially steady and a respective number of particles moved through each of the element cells and intersection cells is substantially steady;

determining the number of particles in each of the pipes and the number of particles moved through each of the element cells and each of the intersection cells when the predetermined convergence condition is satisfied; and determining voltages in the electric network based on the determined number of particles in each of the pipes, and determining currents in the electric network based on the determined number the particles moved through each of the element cells and intersection cells, without solving simultaneous differential equations.

* * * * *